United States Patent [19]

Lewandowski et al.

[11] Patent Number: 4,740,921
[45] Date of Patent: Apr. 26, 1988

[54] PRECHARGE OF A DRAM DATA LINE TO AN INTERMEDIATE VOLTAGE

[75] Inventors: Alan Lewandowski; Perry H. Pelley, III, both of Austin, Tex.

[73] Assignee: Motorola, Inc., Schaumburg, Ill.

[21] Appl. No.: 784,450

[22] Filed: Oct. 4, 1985

[51] Int. Cl.$^4$ .................. G11C 11/34; G11C 11/40
[52] U.S. Cl. ................................. 365/189; 365/203; 365/207
[58] Field of Search .................. 365/189, 203, 207

[56] References Cited

U.S. PATENT DOCUMENTS

| | | | |
|---|---|---|---|
| 4,367,540 | 1/1983 | Shimohigashi | 365/207 |
| 4,467,456 | 4/1984 | Oritani | 365/203 X |
| 4,528,646 | 7/1985 | Ochii et al. | 365/203 |
| 4,542,483 | 9/1985 | Procyk | 365/203 X |
| 4,570,243 | 2/1986 | Sud et al. | 365/203 X |
| 4,584,672 | 1/1986 | Schutz et al. | 365/205 X |
| 4,601,017 | 7/1986 | Mochizuki et al. | 365/203 X |
| 4,608,670 | 8/1986 | Duvvury et al. | 365/203 X |

Primary Examiner—Stuart N. Hecker
Assistant Examiner—Alyssa H. Bowler
Attorney, Agent, or Firm—John A. Fisher; Jeffrey Van Myers; James L. Clingan, Jr.

[57] ABSTRACT

A dynamic random access memory has data line pair which receives data from a selected pair of bit lines. Coupled to the data line pair is a secondary amplifier for amplifying the data provided to the data line pair from the bit line pair. The secondary amplifier has a maximum gain when the inputs are at a voltage intermediate a power supply voltage. Prior to the pair of bit lines being coupled to the data line pair, the data lines are biased to the intermediate voltage which is in the range of maximum gain of the secondary amplifier so that the secondary amplifier will operate at maximum gain which results in increased speed of operation of the dynamic random access memory.

18 Claims, 3 Drawing Sheets

GAIN V. BIAS

PRECHARGE OF A DRAM DATA LINE TO AN INTERMEDIATE VOLTAGE

CROSS-REFERNECE TO RELATED APPLICATIONS

Related subject matter is disclosed in U.S. application Ser. No. 06/784449, entitled "DRAM Restore System," filed simultaneously herewith and assigned to the assignee hereof.

FIELD OF THE INVENTION

The invention relates to random access memories (RAMs), and more particularly to data line precharge in a RAM.

BACKGROUND OF THE INVENTION

In dynamic RAMs (DRAMs) a bit pair develops a voltage differential which is amplified by a sense amplifier. A selected bit line pair is coupled to a data line pair where amplification also occurs. A secondary amplifier which is coupled to the data line pair is also coupled to an output buffer for providing the output of the DRAM. The speed with which the secondary amplifier can resolve data provided thereto directly affects the access time of the DRAM. The speed of the secondary sense amplifier is directly affected by its gain. The data lines have in the past been precharged at or near VDD, the power supply voltage of about 5 volts. This was effective in establishing a predetermined voltage against which a convenient voltage differential could be driven. Particularly in view of the difficulty that a sense amplifier has in sourcing current, a sense amplifier is much more effective in sinking current. Consequently, a larger voltage differential could be established by only requiring the sense amplifier to sink current to establish the voltage differential on the data lines. This was effective but did not maximize the usage of the gain potential of the secondary amplifier.

SUMMARY OF THE INVENTION

An object of the present invention is to provide an improved technique for sensing data in a DRAM.

Another object of the invention is to improve the access time in a DRAM.

Yet another object of the invention is to provide a DRAM with an improved data line precharge technique.

These and other objects are achieved in a dynamic random access memory which has a plurality of bit lines, a plurality of word lines intersecting the plurality of bit lines, a plurality of refreshable memory cells located at intersections of the bit lines and the word lines, an address input circuit, a row decoder circuit, a plurality of sense amplifiers coupled to respective bit lines, a column decoder circuit, a secondary amplifier coupled to the data line pair, an output circuit, and a data line precharge circuit. The address input circuit sequentially receives a row address then a column address, and provides said row address as an output in response to a first externally generated clock signal being active and provides said column address as an output after providing said row address. The row decoder circuit enables a selected word line in response to receiving the row address. Each sense amplifier senses data stored in a memory cell coupled to the respective bit line and the selected word line in response to the selected word line being enabled and provides complementary outputs indicative of the data stored in the sensed memory cell. The column decoder circuit couples the complementary outputs of a selected sense amplifier to a common data line pair in response to receiving the column address signal from the address input means. The secondary amplifier senses the data indicated by the complementary outputs of the selected sense amplifier and provides an output indicative of the data indicated by the selected sense amplifier. The secondary amplifier is coupled to a pair of power supply terminals. The output circuit couples the output of the secondary sense amplifier to an output of the memory in response to a second externally generated clock signal being externally generated clock signal being active. The data line precharge circuit, prior to the column decoder coupling the output of the selected sense amplifier to the secondary sense amplifier, provides a bias voltage on the data line pair intermediate that applied between the two power supply terminals.

DESCRIPTION OF THE INVENTION

Figure 1:
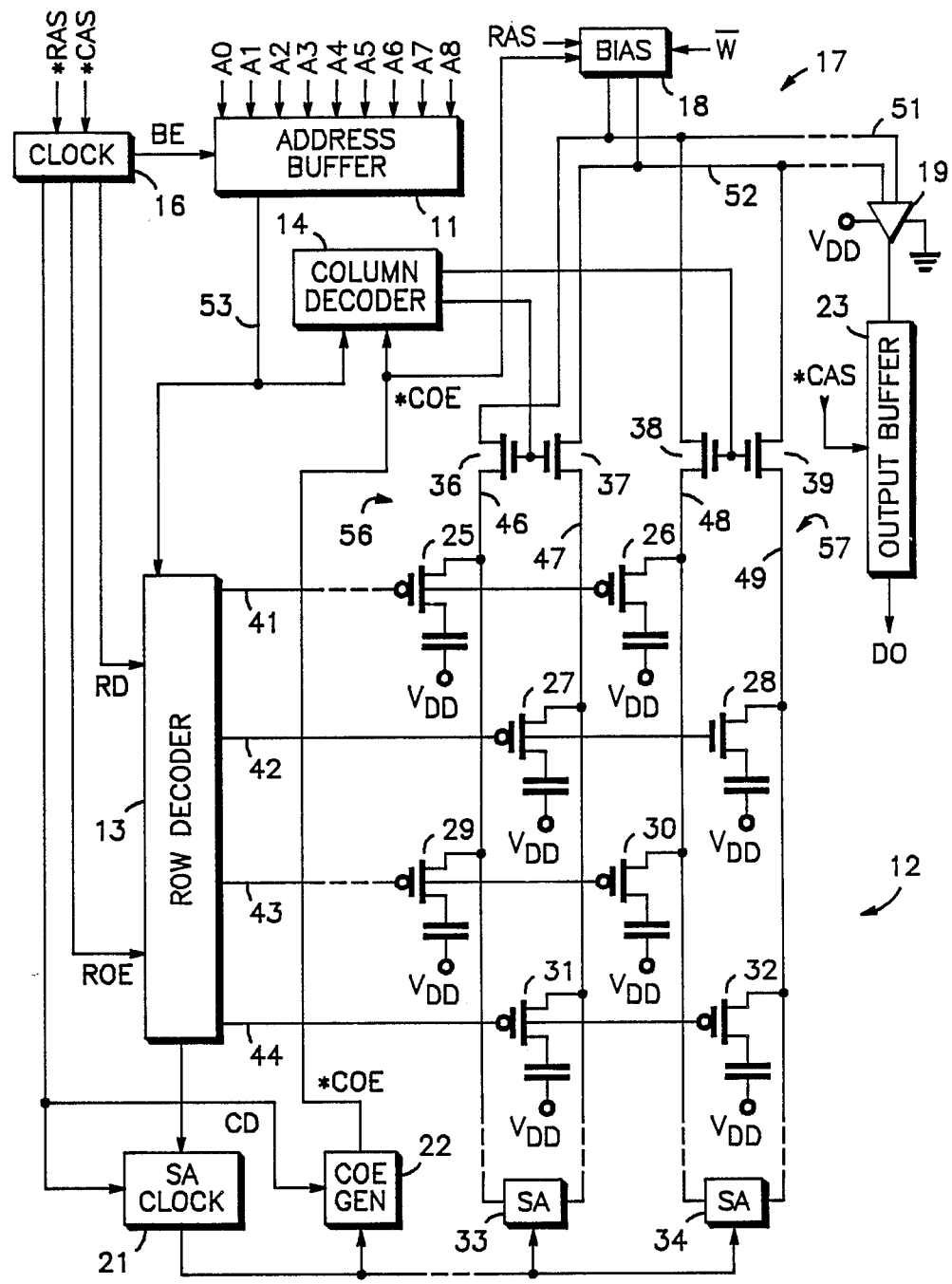
FIG. 1 is a combination of a block diagram and circuit diagram of a memory according to a preferred embodiment of the invention.

Shown in FIG. 1 is a memory 10 comprised generally of an address buffer circuit 11, an array 12, a row decoder 13, a column decoder 14, a clock circuit 16, a data line pair 17, a data line bias circuit 18, a secondary amplifier 19, a sense amplifier clock circuit 21, a column enable generator 22, and an output buffer 23. Array 12 is comprised of a plurality of intersecting word lines and bit lines with a dynamic random access memory cell at each intersection of a bit line and word line and a sense amplifier for each pair of bit lines. Shown in FIG. 1, array 12 is comprised of memory cells 25, 26, 27, 28, 29, 30, 31, and 32; sense amplifiers 33 and 34; coupling transistors 36, 37, 38, and 39; and word lines 41, 42, 43, and 44; and bit lines 46, 47, 48, and 49. Data line pair 17 is comprised of data lines 51 and 52. Memory array cells 25–32 are P channel transistors with a storage capacitor. Such use of P channel transistors has not been as common as using N channel transistors but is nonetheless well known in the art. Each memory cell 25–32 has a control input, a data input/output (I/O), and a reference terminal. The reference terminal of all memory cells 25–32 is connected to VDD, a positive power supply terminal for receiving a 5 volt power supply voltage.

Address buffer circuit 11 receives address signals A0, A1, A2, A3, A4, A5, A6, A7, and A8. Clock 16 receives a low address strobe signal *RAS. An asterisk (*) is used to indicate that the signal is active when it is a logic low. Address signals A0–A8 are multiplexed as first 9 row address signals then 9 column address signals. This provides for addressing 262,144 memory locations. This is conventional for what is commonly known as a 256K DRAM. Address signals A0–A8 are multiplexed onto an address bus 53 which is coupled to row decoder 13 and column decoder 14. Address buffer circuit 11 provides the row address and the column address onto bus 53 in response to address signals A0–A9. In a typical NMOS DRAM the row address is clocked by *RAS and the column address is clocked by a column address strobe signal *CAS. In CMOS DRAMs, however, it has been shown that there are advantages to timing both the column address and row address from only signal *RAS. Memory 10 is a CMOS DRAM in which most of the control circuitry such as circuit 11, circuit 16, decoders 13 and 14, circuit 18, amplifier 19, and buffer 23 are CMOS. Upon signal *RAS switching from an inactive state to an active state, clock circuit 16 generates a buffer enable signal BE. In response to signal BE, the address signals A0-A8 which are present as inputs to circuit 11 are latched into buffer 11 and coupled onto bus 53 as row address signals. Signal BE is active for about 4 nanoseconds (ns). Address buffer 11 provides the latched address onto bus 53 while signal BE is inactive. Circuit 16 also provides a row enable signal ROE in the active state to row decoder 13 in response to signal *RAS being active. The presence of signal ROE in the active state causes row decoder 13 to respond to the row address present on bus 53. Signal ROE is active for a relatively short time, approximately 4 ns but sufficiently long for row decoder 13 to latch the row address received on bus 53. After signal ROE becomes inactive, row decoder 13 no longer responds to signals present on bus 53. Signal ROE is timed to become active only after the address received by row decoder 13 is the row address which has been latched by buffer 11.

Signal BE is switched again to the active state a predetermined time delay after signal BE had previously switched to the inactive state. This second time that signal BE switches to the active state after signal *RAS has become active causes address signals A0-A8 received by buffer 11 to be coupled onto bus 53 as the column address. Column decoder 14 is responsive to the column address on bus 53 after column decoder 14 has received a column enable signal *COE. Signal *COE is received by column decoder 14 from column enable generator 22. Generator 22 provides signal *COE in response to sense amplifier clock 21 which also enables sense amplifiers 33 and 34.

Row decoder 13, in response to receiving and latching the row address received from bus 53, enables a selected one of word lines 41-44. Only 4 word lines are shown for clarity of description. It is of course well known that a 256K DRAM has many more word lines, bit lines, and sense amplifiers than those shown. The enabled word line is latched in the enabled state. After the selected word line has been enabled, row decoder 13 causes clock 21, which is connected to row decoder 13, to enable sense amplifiers 33 and 34 as well as causing generator 22 to activate signal *COE. The activation of signal *COE is timed to activate column decoder 14 after sense amplifiers 33 and 34 have developed signal on the bit lines to which they are coupled. Sense amplifier 33 is coupled to bit lines 46 and 47. Sense amplifier 34 is coupled to bit lines 48 and 49. Memory cells 25 and 26 have their control inputs connected to word line 41. Memory cells 27 and 28 have their control inputs connected to word line 42. Memory cells 29 and 30 have their control inputs connected to word line 43. Memory cells 31 and 32 have their control inputs connected to word line 44. Memory cells 25 and 29 have their data I/O's connected to bit line 46. Memory cells 27 and 31 have their data I/O's connected to bit line 47. Memory cells 26 and 30 have their data I/O's connected to bit line 48. Memory cells 28 and 32 have their data I/O's connected to bit line 49.

Assuming, that the row address has selected word line 42, word line 42 is enabled by row decoder switching it from a logic high to a logic low. This causes memory cells 27 and 28 to output data onto bit lines 47 and 49, respectively. No memory cells along bit lines 46 and 48 are enabled. Bit lines 46 and 47 comprise a bit line pair 56, and bit lines 48 and 49 comprise a bit line pair 57. Sense amplifiers 33 and 34 are connected to bit line pairs 56 and 57, respectively. Prior to word line 42 being enabled, bit line pairs 56 and 57 are equalized by sense amplifiers 33 and 34 to approximately ½ VDD. The equalization of the bit lines by the sense amplifiers is achieved under the control of clock 21 in response to active signal *COE being received by clock 21. After word line 42 is enabled, clock 21 enables sense amplifiers 33 and 34 so that sense amplifiers 33 and 34 begin amplifying the voltage differential caused by memory cells 27 and 28 outputting data onto bit lines 47 and 49, respectively. Very soon after sense amplifiers 33 and 34 have begun amplifying the differential on bit line pairs 56 and 57, a bit line pair, selected by column decoder 14, is coupled to data line pair 17.

Column decoder 14 has a plurality of outputs. One of these outputs is selected to be active by the column address. Only a first and a second output are shown in FIG. 1. Coupling transistors 36 and 37 have a control gate connected to the first output of column decoder 14. Coupling transistors 38 and 39 each have a control gate connected to the second output of column decoder 14. Transistor 36 has first current electrode connected to data line 51 and a second current electrode connected to bit line 46. Transistor 37 has first current electrode connected to data line 52 and a second current electrode connected to bit line 47. Transistor 38 has first current electrode connected to data line 51 and a second current electrode connected to bit line 48. Transistor 39 has first current electrode connected to data line 52 and a second current electrode connected to bit line 49. Transistors 36-39 are N channel transistors. Bit line pair 56 is coupled to data line pair 17 via transistors 36 and 37. The first output of decoder 14 is selected to become active at a logic high by the column address. The logic high is not provided by decoder 14 until signal *COE becomes active. Signal *COE provides the control so that a bit line pair is not coupled to data line pair 17 until after the sense amplifiers have begun amplifying the voltage differential on the bit line pairs.

Figure 2:
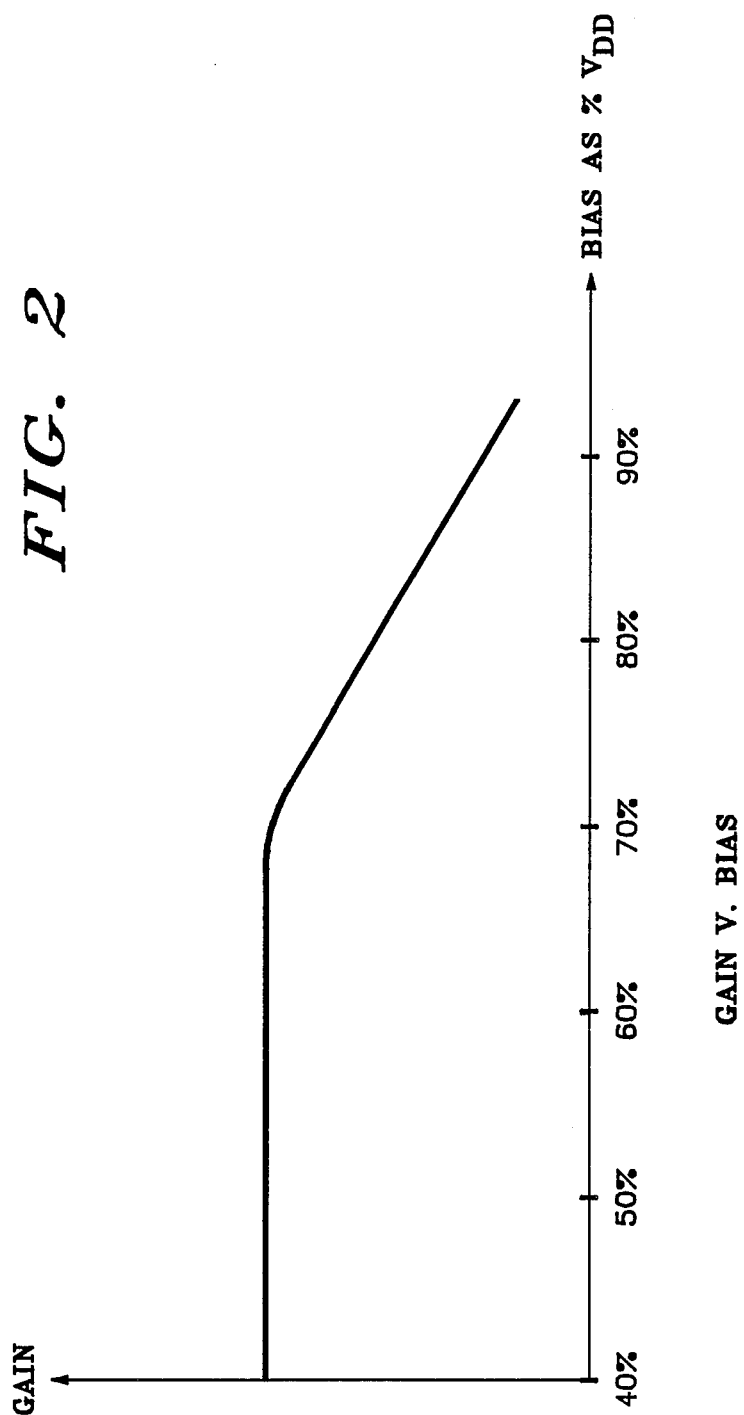
FIG. 2 is a gain plot of a conventional CMOS secondary amplifier.

Data lines 51 and 52 have been precharged to a voltage approximately equal to the voltage at which the bit lines are equalized prior to a word line being enabled. This is approximately ½ VDD but a few tenths of a volt greater than ½ VDD. This bias of data lines 51 and 52 is achieved by bias circuit 18 which has a first output connected to data line 51, a second output connected to data line 52, a first power supply receiving terminal connected to VDD, and a second power supply receiving terminal connected to ground. Biasing data lines 51 and 52 at approximately ½ VDD has the benefit of biasing amplifier 19 in its optimum gain region. A plot of gain versus bias voltage for a conventional CMOS differential amplifier such as amplifier 19 is shown in FIG. 2. The gain begins to noticeably decrease when the bias voltage reaches about 70% of the power supply voltage. Consequently, the bias voltage is desirably at some intermediate voltage not in excess of 70% of the power supply voltage. Bias circuit 18 begins establishing the desired bias voltage on data line pair 17 in response to *RAS becoming active. A first portion of bias circuit 18 is controlled by signal *COE, and a second portion by a write signal *W. The second portion of bias circuit 18, which is controlled by signal *W is active when signal *W is inactive which is when memory 10 is in a read mode. Application of the first portion of the bias is terminated by bias circuit 18 in response to receiving active signal *COE. Bias circuit 18 is thus no longer applying the full bias when a bit line pair is coupled to data line pair 17 because the column decoder is not activated until signal *COE is active. When signal *COE becomes active, a bit line pair is selected which in effect is the selection of a sense amplifier to be coupled to data line pair 17. The second portion of bias circuit 18 remains active when the selected sense amplifier is coupled to data line pair 17 to offset the bias that the sense amplifier would establish if no bias were otherwise applied to the data line pair. This keeps data line pair 17 biased in the high gain region of secondary amplifier 19.

With amplifier 19 operating in its optimum gain state due to the bias on data lines 17, the voltage differential developed on the data lines 51 and 52 is amplified more by amplifier 19 than in the prior art in which the data lines were biased near or at the power supply voltage. This results in faster resolution of the data represented by the voltage differential coupled onto data line pair 17. Amplifier 19 has an output which is the amplification of the differential input provided by data lines 51 and 52. Output buffer 23 has an input connected to the output of amplifier 19, and an output for providing output data signal DO as an output of memory 10. Output buffer 23 has threshold at which it can reliably output the data signal DO as required. This threshold of output buffer DO is reached more quickly due to the increased functional gain of 19 which in turn is due to biasing the data lines at the intermediate voltage.

Output buffer 23 clocks the data provided on its input as signal DO in response to signal *CAS being active. Because the data is ready sooner, the specification for the time between signal *RAS becoming active and signal DO being valid is reduced.

For the example described in which bit line pair 56 is coupled to data line pair 17, bit lines 46 and 47 do not reach full voltage separation which is required for optimum restore of the accessed memory cell, memory cell 27. One bit line should be at ground and the other should be at VDD for optimum restore. If memory cell 27 was storing a logic high, then bit line 47 should be at VDD for optimum restore. Conversely, if memory cell 27 was storing a logic low, then bit line 47 should be at ground for optimum restore. Bit lines 46 and 47 are not fully separated because they are coupled to data line pair 17. All of the bit line pairs which are not accessed are fully separated so that the accessed cells on the unselected bit lines are fully refreshed. In the past both the column decoder and the row decoder were disabled at the same time Disabling the column decoder decoupled the selected bit lines from the data lines. Disabling the row decoder disabled all of the word lines including the selected word line. Once the selected word line is disabled, the restore of the memory cells along that word line is completed.

In order to achieve optimum restore, column decoder 14 is disabled before row decoder 13 is disabled. The previously selected bit lines, bit lines 46 and 47 of the described example, are then fully separated while the selected word line, word line 42, is enabled. With word line 42 enabled, selected memory cell 27 can still be restored. Column decoder 14 is disabled in response to signal *RAS becoming inactive. Row decoder 13, however, is not disabled until a predetermined time delay following signal *RAS becoming inactive. Row decoder 13 is disabled in response to a row decoder disable signal RD, received from clock 16, becoming active. Signal RD becomes active about 15 ns after *RAS has switched to the inactive state. This has the effect of keeping the selected word line enabled for about 15 ns after the selected bit line pair, bit line pair 56, has been decoupled from the data line pair, data line pair 17. With bit line pair 56 decoupled from data line 17, sense amplifier 33 completes the separation of bit lines 46 and 47. Within the 15 ns that word line 42 is enabled after bit line pair 56 is decoupled from data line pair 17, on bit lines 46 and 47 is brought to VDD, and the other is to ground. The optimum restore of memory cell 27 is thus achieved. This optimum restore is achieved without increasing the time that signal *RAS must be active. The minimum time period that signal *RAS must be active is also known as the minimum active cycle time. The active cycle time is thus not affected by this refresh scheme. Additionally, there is no dependence upon signal *CAS for achieving this restore. The gains of coupling transistors 36 and 37 also need not be reduced in order to reduce the loading effect on the bit lines. The gains of coupling transistors 36-39 can be chosen so that speed need not be sacrificed in order to obtain adequate restore of the memory cells.

Figure 3:
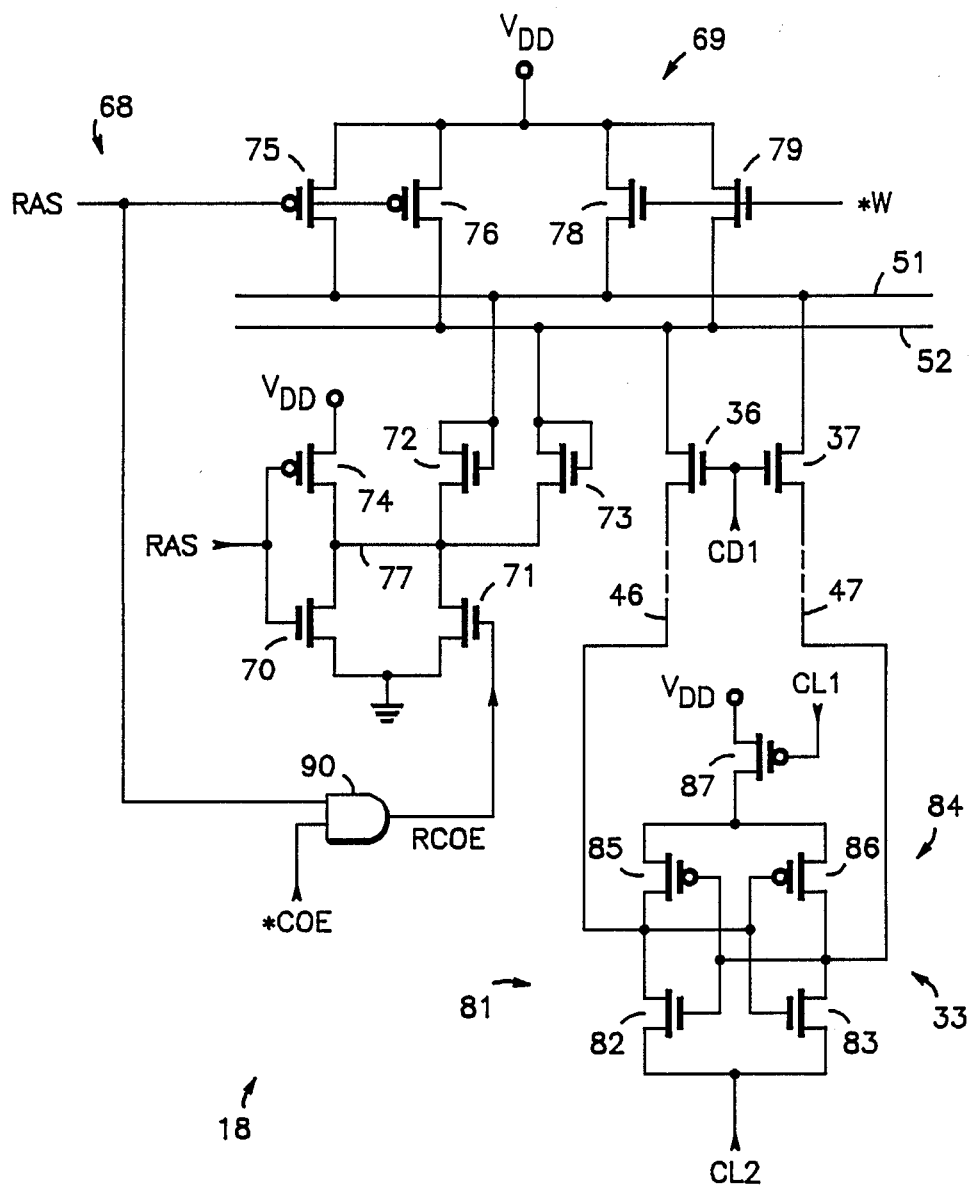
FIG. 3 is a circuit diagram of a circuit for biasing data lines of the memory of FIG. 1 according to a preferred embodiment of the invention.

Shown in FIG. 3 is a circuit diagram of bias circuit 18. Circuit 18 is comprised of the first section, a section 68, and the second section, section 69. The first section is comprised of N channel transistors 70, 71, 72, and 73 and P channel transistors 74, 75, and 76. Transistor 70 has a gate for receiving signal RAS, a source connected to ground, and a drain connected to a node 71. Transistor 74 has a gate for receiving signal RAS, a source connected to VDD, and a drain connected to node 77. Transistor 71 has a gate for receiving signal *COE, a source connected to ground, and a drain connected to node 77. Transistor 72 has a source connected to node 77, and a gate and a drain connected to data line 51. Transistor 73 has a source connected to node 77, and a gate and a drain connected to data line 52. Transistor 75 has a gate for receiving signal RAS, a drain connected to data line 51, and a source connected to VDD. Transistor 76 has a gate for receiving signal RAS, a drain connected to data line 52, and a source connected to VDD. Second section 69 is comprised of N channel transistors 78 and 79. Transistor 78 has a gate for receiving signal *W, a drain connected to VDD, and a source connected to data line 51. Transistor 79 has a gate for receiving signal *W, a drain connected to VDD, and a source connected to data line 52. Bias circuit 18 further comprises a NAND gate 90 which has a first input for receiving a signal RAS, which is generated complementary to signal *RAS, and a second input for receiving signal *COE, and an output for providing a signal RCOE. Also shown in FIG. 3 are coupling transistors 36 and 37, bit lines 46 and 47, and sense amplifier 33. Sense amplifier 33 comprises an N channel amplifier 81 comprised of N channel transistors 82 and 83, a P channel amplifier 84 comprised of P channel transistors 85 and 86, and a P channel clocking transistor 87. The configuration of sense amplifier 33 having a cross-coupled N channel amplifier in parallel with a cross-coupled P channel amplifier is conventional for CMOS sense amplifiers. Sense amplifier 33 is shown as being clocked by signals CL1 and CL2 from clock circuit 21, Coupling transistors 36 and 37 are shown as being clocked by a column decoder signal CD1 from column decoder 14.

When signal RAS is inactive at a logic low to indicate that memory 10 is in the inactive cycle, transistors 75 and 76 precharge data lines 51 and 52 to VDD, and transistor 74 precharges node 77 to VDD. Transistor 70 is not conducting when signal RAS is inactive. During the active cycle, signal RAS becomes active at a logic low in response to signal *RAS switching to a logic low. Transistors 74, 75, and 76 become non-conductive while transistor 70 becomes conductive. Signal RCOE switches to a logic high in response to signal *RAS becoming active. While signal RCOE is a logic high transistor 71 is conductive. Transistors 78 and 79 are conductive whenever memory 10 is in the read mode which is indicated by signal *W being a logic high. Transistor 71 is chosen to be of relatively high gain in relation to that of transistors 72 and 73. Transistor 71 thus pulls node 77 to very near ground. Data lines 51 and 52 begin being discharged from VDD toward the predetermined bias potential of a few tenths of a volt above ½ VDD. The predetermined bias potential is obtained by selecting the gains of transistors 78, 79, 72, 73, and 71. Transistors 78 and 72 form a resistor divider for setting the bias potential on data line 51. Transistors 79 and 73 form a resistor divider for setting the bias potential on data line 52. The desired bias potential is thus obtained by choosing the ratio of the gain of transistor 78 to transistor 72 and the gain of transistor 79 to transistor 73. The rate of discharge is primarily related to the gain of transistors 72 and 73 and the capacitance of data lines 51 and 52. Data lines 51 and 52 are quite long and thus highly capacitive. Transistors 72 and 73 to have a gain such that data lines 51 and 52 would be discharged to the desired bias level of a few tenths of a volt over ½ VDD before the time signal *COE switches to a logic low. Signal *COE switches to a logic low a predetermined time following signal *RAS switching to a logic low. Signal *COE switches to a logic low to cause column decoder 14 to cause a pair of bit lines to be coupled to data lines 51 and 52. Bias circuit 18 should release control of data lines 51 and 52 before the selected bit lines are connected thereto. Signal RCOE is conveniently generated for this purpose. Using signal RCOE provides for disabling second section 68 of bias circuit 18 just before data is coupled to the bit lines. This has the advantage of not releasing control of data lines 51 and 52 too soon so as to minimize the time available for data lines 51 and 52 to drift from the desired bias. Transistor 70 remains conductive throughout the active cycle to keep node 77 from drifting to some undesirable voltage. In CMOS it is particularly desirable to keep nodes from floating due to possible latch-up problems.

When a bit line pair such as bit lines 46 and 47 are coupled to data lines 51 and 52, data developed by sense amplifier 33 begins separating data lines 51 and 52. N channel transistors 82 and 83 have the most effect in the early stages of amplification so that the tendency is for the data lines to become biased at a reduced voltage. Transistors 78 and 79 are left conductive to match the current pull of N channel transistors 82 and 83. This results in the separation of data lines 51 and 52 being centered near the desired bias voltage. The rate of separation is not significantly effected by keeping transistors 78 and 79 conductive but the center point of the separation is. This results in keeping amplifier 19 in the high gain bias range.

The voltage range which will provide much of the desired advantage is fairly wide. The main desire is for the bias voltage to be in the maximum gain region of the secondary amplifier, amplifier 19, which is in the range of 30% to 70% of VDD. Another approach would be much the same as that used for equalizing the bit lines. Data lines 51 and 52 could be fully separated between VDD and ground, then equalized to about ½ VDD, and then released just before the pair of bit lines are coupled thereto. Circuit 18 does not need any additional timing signals to those already required in operation of memory 10. Additionally, circuit 18 provides for a better opportunity to match the bias voltage on the bit lines.

We claim:
1. A dynamic random access memory, comprising:
a plurality of bit lines;
a plurality of word lines intersecting the plurality of bit lines;
a plurality of refreshable memory cells located at intersections of the bit lines and the word lines;
address input means for sequentially receiving a row address then a column address, and providing said row address as an output in response to a first externally generated clock signal being active and providing said column address as an output after providing said row address;
row decoder means for enabling a selected word line in response to receiving the row address from the address input means;
a plurality of sense amplifiers, coupled to respective bit lines, each for sensing data stored in a memory cell coupled to the respective bit line and the selected word line in response to the selected word line being enabled and for providing complementary outputs indicative of the data stored in the sensed memory cell;
column decoder means for coupling the complementary outputs of a selected sense amplifier to a common data line pair in response to receiving the column address signal from the address input means;
a secondary amplifier, coupled to the data line pair, for sensing the data indicated by the complementary outputs of the selected sense amplifier and for providing an output indicative of the data indicated by the selected sense amplifier, said secondary amplifier coupled to a pair of power supply terminals;
output means for coupling the output of the secondary amplifier to an output of the memory in response to a second externally generated clock signal being active; and
data line precharge means for, prior to the column decoder means coupling the output of the selected sense amplifier to the secondary amplifier, providing a bias voltage on the data line pair intermediate that applied between the two power supply terminals.

2. The memory of claim 1 wherein the intermediate voltage is between 30% and 70% of the voltage applied between the two power supply terminals.

3. The memory of claim 2 wherein the precharge means comprises:
load means for supplying current to the data lines;
sink means for sinking current from the data lines prior to the column decoder means coupling the output of the selected sense amplifier to the secondary sense amplifier.

4. The memory of claim 3 wherein the column decoder couples the selected sense amplifier to the data lines in response to a column enable signal switching to a first logic state and the sink means is disabled in response to the column enable signal switching to the first logic state.

5. The memory of claim 4 wherein the load means comprises:
   a first transistor having a first current electrode coupled to the first power supply terminal, a second current electrode coupled to a first of the data lines, and a control electrode for receiving a write enable signal; and
   a second transistor having a first current electrode coupled to the first power supply terminal, a second current electrode coupled to a second of the data lines, and a control electrode for receiving the write enable signal.

6. The memory of claim 5 wherein the sink means comprises:
   a first load having a first terminal coupled to the first data line, and a second terminal coupled to a control node;
   a second load having a first terminal coupled to the second data line, and a second terminal coupled to the control node;
   a third transistor having a first current electrode coupled to the control node, a second current electrode coupled to the second power supply terminal, and a control electrode for receiving a control signal; and
   control means for generating the control signal in response to the column enable signal.

7. In a memory having a plurality of bit lines; a plurality of word lines intersecting the plurality of bit lines; a plurality of memory cells coupled to respective bit lines and word lines at intersections thereof, wherein pairs of bit lines develop a voltage differential indicative of data stored in a respective memory cell coupled to an enabled word line and at least one of the bit lines of the bit line pair; and a secondary amplifier coupled to a data line pair for amplifying a voltage differential applied thereto, said secondary amplifier coupled to a pair of power supply terminals for receiving a power supply voltage therebetween; a method for amplifying a voltage differential indicative of data stored in a memory cell, comprising:
   enabling a word line so that bit line pairs develop voltage differentials indicative of data stored in memory cells coupled to the enabled word line;
   biasing the data line pair to a voltage intermediate the voltage applied between the power supply terminals of the secondary amplifier;
   coupling the voltage differential of a selected bit line pair to the data line pair; and
   amplifying the voltage differential coupled to the data line pair with the secondary amplifier.

8. The method of claim 7 wherein the data lines are biased to a voltage between 30 percent and 70 percent of the voltage applied between the two power supply terminals.

9. A memory having a plurality of bit lines; a plurality of word lines intersecting the plurality of bit lines; a plurality of memory cells coupled to respective bit lines and word lines at intersections thereof, wherein pairs of bit lines develop a voltage differential indicative of data stored in a respective memory cell coupled to an enabled word line and at least one of the bit lines of the bit line pair; comprising:
   a pair of data lines;
   a secondary amplifier, coupled to the pair of data lines, for amplifying a voltage differential coupled to said data lines, wherein said secondary amplifier is coupled to a pair of power of power supply terminals for receiving a power supply voltage;
   row decoder means, coupled to the word lines, for enabling a selected word line so that a voltage differential is developed on pairs of bit lines indicative of data stored in the memory cells coupled to the enabled word line;
   bias means, coupled to the data lines, for biasing the data lines to a bias voltage intermediate the voltage applied to the pair of power supply terminals; and
   column decoder means, coupled to the bit lines, for coupling a selected bit line pair to the data lines;
   whereby the secondary amplifier amplifies the voltage differential coupled to the pair of data lines from the selected pair of bit lines.

10. The memory of claim 9 wherein the column decoder is further characterized as coupling the selected bit line pair to the data line after the bias means has biased the pair of data lines to the bias voltage.

11. The memory of claim 10 wherein the bias means is disabled when the column decoder means couples the selected pair of bit lines to the pair of data lines.

12. The memory of claim 10 wherein the bias means comprises:
   load means for supplying current to the pair of data lines;
   sink means for sinking current from the data lines prior to the column decoder means coupling the output of the selected sense amplifier to the secondary sense amplifier.

13. The memory of claim 12 wherein the column decoder couples the selected sense amplifier to the data lines in response to a column enable signal switching to a first logic state and the sink means is disabled in response to the column enable signal switching to the first logic state.

14. The memory of claim 13 wherein the load means comprises:
   a first transistor having a first current electrode coupled to the first power supply terminal, a second current electrode coupled to a first of the data lines, and a control electrode for receiving a write enable signal; and
   a second transistor having a first current electrode coupled to the first power supply terminal, a second current electrode coupled to a second of the data lines, and a control electrode for receiving the write enable signal.

15. The memory of claim 14 wherein the sink means comprises:
   a first load having a first terminal coupled to the first data line, and a second terminal coupled to a control node;
   a second load having a first terminal coupled to the second data line, and a second terminal coupled to the control node;
   a third transistor having a first current electrode coupled to the control node, a second current electrode coupled to the second power supply terminal, and a control electrode for receiving a control signal; and control means for generating the control signal in response to the column enable signal.

16. The memory of claim 9 wherein the bias means provides the bias voltage between 30 percent and 70 percent of the power supply voltage provided between the power supply terminals.

17. The memory of claim 16 wherein the column decoder is further characterized as coupling the selected bit line pair to the data line after the bias means has biased the pair of data lines to the bias voltage.

18. The memory of claim 16 wherein the bias means is disabled when the column decoder means couples the selected pair of bit lines to the pair of data lines.

* * * * *